(12) United States Patent
Lym et al.

(10) Patent No.: US 8,526,226 B2
(45) Date of Patent: Sep. 3, 2013

(54) CURRENT CONTROL APPARATUS AND PHASE CHANGE MEMORY HAVING THE SAME

(75) Inventors: Sang Kug Lym, Icheon-si (KR); Yoon Jae Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 348 days.

(21) Appl. No.: 12/983,244

(22) Filed: Dec. 31, 2010

(65) Prior Publication Data

US 2012/0106243 A1 May 3, 2012

(30) Foreign Application Priority Data

Oct. 28, 2010 (KR) .................. 10-2010-0106277

(51) Int. Cl.
*G11C 11/00* (2006.01)

(52) U.S. Cl.
USPC .......................................... 365/163; 365/148

(58) Field of Classification Search
USPC ................................................ 365/163, 148
See application file for complete search history.

(56) References Cited

U.S. PATENT DOCUMENTS

| 2004/0151023 | A1 | 8/2004 | Khouri et al. | |
|---|---|---|---|---|
| 2005/0162303 | A1* | 7/2005 | Cho et al. | 341/200 |
| 2006/0028886 | A1* | 2/2006 | Choi et al. | 365/202 |
| 2006/0109707 | A1 | 5/2006 | Happ et al. | |
| 2007/0230239 | A1 | 10/2007 | Choi et al. | |
| 2008/0016271 | A1* | 1/2008 | Cho et al. | 711/104 |
| 2008/0212362 | A1 | 9/2008 | Choi et al. | |
| 2009/0050869 | A1 | 2/2009 | Kim et al. | |
| 2010/0214819 | A1* | 8/2010 | Kim et al. | 365/148 |
| 2011/0096590 | A1* | 4/2011 | Iwata | 365/148 |

FOREIGN PATENT DOCUMENTS

| JP | 2005-346900 | | 12/2005 |
|---|---|---|---|
| KR | 1020050051135 | A | 6/2005 |
| KR | 100809334 | B1 | 2/2008 |
| KR | 1020100041470 | A | 4/2010 |

OTHER PUBLICATIONS

Kwang-Jin Lee et al., A 90 nm 1.8 V 512 Mb Diode-Switch PRAM With 266 MB/s Read Throughput, IEEE Journal of Solid-State Circuits, Jan. 2008, pp. 150-162, vol. 43, No. 1.

* cited by examiner

*Primary Examiner* — Hoai V Ho
*Assistant Examiner* — Tri Hoang
(74) *Attorney, Agent, or Firm* — William Park & Associates Patent Ltd.

(57) ABSTRACT

A current control apparatus of a phase change memory includes a temperature sensing block having an output voltage level which varies depending on temperature of an internal circuit and a write driver configured to control an amount of program current provided to a memory cell in response to the output voltage level of the temperature sensing block.

14 Claims, 3 Drawing Sheets

CURRENT CONTROL APPARATUS AND PHASE CHANGE MEMORY HAVING THE SAME

CROSS-REFERENCES TO RELATED APPLICATION

The present application claims priority under 35 U.S.C. §119(a) to Korean application number 10-2010-0106277, filed on Oct. 28, 2010, in the Korean Intellectual Property Office, which is incorporated herein by reference in its entirety.

BACKGROUND

1. Technical Field

The present invention relates to a semiconductor integrated circuit, and more particularly, to a current control apparatus and a phase change memory having the same.

2. Related Art

Nonvolatile memory apparatuses maintain stored data even though power supply is cut off. Therefore, the nonvolatile memory apparatuses are widely adopted in computers, mobile telecommunication systems, memory cards, and so on.

A representative example of the nonvolatile memory apparatus is flash memory. The flash memory adopts a memory cell structure such as a stacked gate structure. In such a flash memory, a film quality of a tunnel oxide layer should be improved, and a coupling ratio between cells should be increased, in order to enhance the reliability and program efficiency of flash memory cells.

Currently, a phase change memory apparatus having a random access property of DRAM is being developed as a replacement for flash memory.

In general, a phase change memory apparatus includes a plurality of word lines, a plurality of bit lines arranged in such a manner as to intersect the plurality of word lines, and a plurality of phase change memory cells in the respective intersection points between the word lines and the bit lines.

Each of the phase change memory cells includes a switching element coupled to a word line and a variable resistor element coupled between the switching element and a bit line. The variable resistor element may be formed of a phase change material whose resistance value changes according to the amount of current provided.

Referring to FIG. 1, the phase change material used as the variable resistor element of the phase change memory cell is characterized in that the resistance value changes with temperature. Therefore, the phase change material has a relatively low resistance value at high temperature and a relatively high resistance value at low temperature. Accordingly, while the property change of the phase change material used as the variable resistor material at high temperature is larger than at a nominal temperature, the property change at low temperature is smaller than at the nominal temperature. The nominal temperature may be, for example, 70° F. Therefore, the resistance value of the phase change material may not be consistent for a predetermined program pulse because the degree of the property change differs depending on temperature. In this case, a data storage error may occur depending on the temperature at the time of storage.

SUMMARY

In one embodiment of the present invention, a current control apparatus of a phase change memory includes a temperature sensing block having an output node whose voltage level varies depending on temperature of an internal circuit and a write driver configured to control an amount of program current provided to a memory cell in response to the voltage level at the output node.

The temperature sensing block may be configured to provide an output voltage level at the output node that is directly proportional to temperature.

The write driver may be configured to output current that is inversely proportional to temperature.

In another embodiment of the present invention, a current control apparatus of a phase change memory includes a temperature sensing block configured to provide a different level of output voltage depending on temperature ranges, a reset control unit coupled to the temperature sensing block and configured to be driven during a reset mode, a set control unit coupled to the temperature sensing block and configured to be driven during a set mode, and a write driver configured to provide current to a memory cell in response to the level of the output voltage of the temperature sensing block.

In another embodiment of the present invention, a phase change memory includes a phase change memory cell including a variable resistor having a resistance value which varies depending on temperature and a current control apparatus configured to sense the temperature, and output current to the phase change memory cell that is inversely proportional to temperature.

BRIEF DESCRIPTION OF THE DRAWINGS

Features, aspects, and embodiments are described in conjunction with the attached drawings, in which.

DETAILED DESCRIPTION

Hereinafter, a current control apparatus and a phase change memory having the same according to the present invention will be described below with reference to the accompanying drawings through exemplary embodiments.

Figure 1:
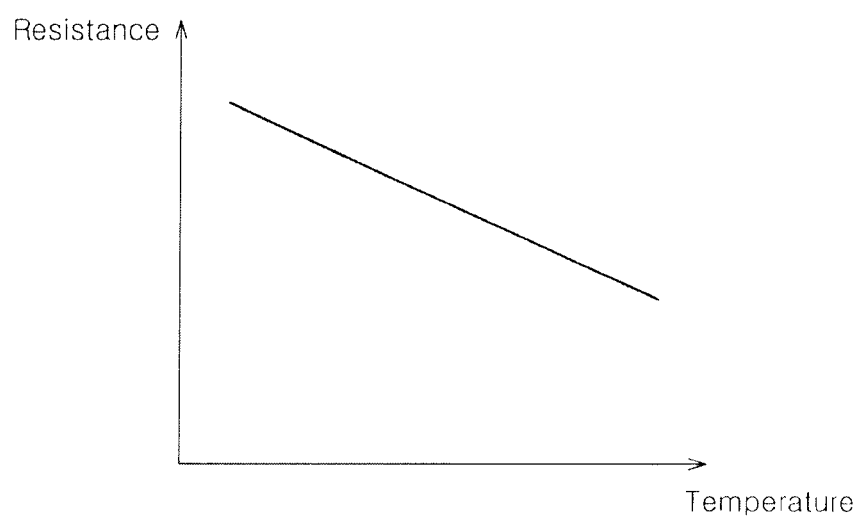
FIG. 1 is a graph showing resistance changes depending on the temperature of a conventional phase change memory.
Figure 2:
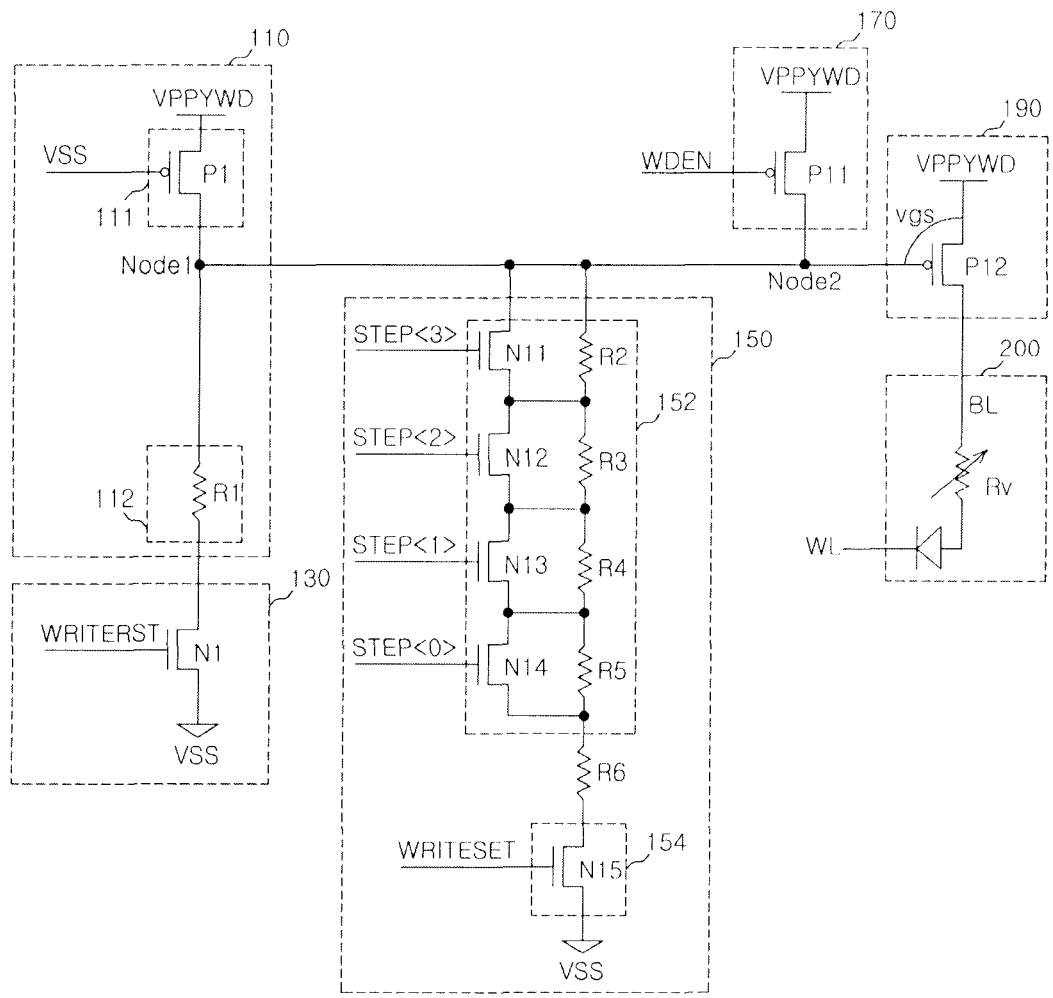
FIG. 2 is a circuit diagram illustrating a current control apparatus of a phase change memory according to one embodiment of the invention.

FIG. 2 is a circuit diagram illustrating a current control apparatus of a phase change memory according to one embodiment.

Referring to FIG. 2, the current control apparatus 100 of the phase change memory according to the embodiment includes a temperature sensing block 110, a reset control unit 130, a set control unit 150, a write driver enable unit 170, and a write driver 190. There may also be a memory cell 200 which is driven by the current control apparatus 100.

The temperature sensing block 110 is configured to generate an output voltage level which increases as the temperature increases, and generate an output voltage level which decreases as the temperature decreases. The temperature sensing block 110 may include a first temperature sensing section 111 and a second temperature sensing section 112 which are coupled in series. The first temperature sensing section 111 may have resistance which is inversely proportional to temperature, and the second temperature sensing section 112 may have resistance which is proportional to temperature.

In this embodiment, the first temperature sensing section 111 may include a PMOS transistor P1 which is turned on at all times. As well known, a PMOS transistor is easily turned on, because its threshold voltage decreases as the temperature increases. Therefore, when the temperature increases for a constant predetermined voltage at a gate voltage, a larger amount of current may flow in the PMOS transistor, and thus the effective resistance of the PMOS transistor may be reduced. The second temperature sensing section 112 may include a resistor R1. The resistor R1 has such a property that it resistance value increases as the temperature increases. The output voltage of the temperature sensing block 110 is at a node Node1 between the first temperature sensing section 111 and the second temperature sensing section 112.

The reset control unit 130 may include an NMOS transistor N1 which is turned on in response to a write reset signal WRITERST. The NMOS transistor N1 is configured to drop the voltage of the first node Node1 when the write reset signal WRITERST is enabled. Since only the resistor R1 is associated with the reset control unit 130, the voltage at the first node Node1 may be described as being rapidly controlled by the reset control unit 130.

Figure 3:
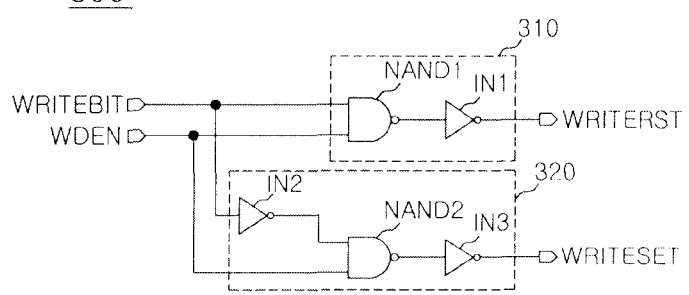
FIG. 3 is a circuit diagram illustrating a write signal generator of the phase change memory according to an embodiment of the invention.

The write reset signal WRITERST may be generated by a write signal generator 300 illustrated in FIG. 3. The write signal generator 300 includes a write reset signal generation unit 310 and a write set signal generation unit 320. The write reset signal generation unit 310 is configured to perform an AND operation on a write bit signal WRITEBIT and a write driver enable signal WDEN to generate the write reset signal WRITERST. The write reset signal generation unit 310 may include a first NAND gate NAND1 configured to perform a NAND operation on the write bit signal WRITEBIT and the write driver enable signal WDEN and an inverter IN1 configured to invert the first NAND gate NAND1.

The write set signal generation unit 320 is configured to perform an AND operation on an inverted level of the write bit signal WRITEBIT and the write driver enable signal WDEN to generate a write set signal WRITESET. The write set signal generation unit 320 may include a first inverter IN1 configured to inverted level of the write bit signal WRITEBIT, a second NAND gate NAND2 configured to perform a NAND operation on the inverted level of the write bit signal WRITEBIT and the write driver enable signal WDEN, and a second inverter IN3 configured to invert an output signal of the second NAND gate NAND2.

Referring to FIG. 2, the set control unit 150 may include a slow quenching section 152, a voltage drop resistor R6, and a set enable section 154. The slow quenching section 152 is coupled to the output node of the temperature sensing block 110, that is, the first node Node1. The slow quenching section 152 includes a plurality of transistors N11 to N14 and a plurality of resistors R2 to R5. The plurality of transistors N11 to N14, coupled in series, is configured to be turned on in response to a plurality of step signals STEP<0:3>. The plurality of resistors R2 to R5 is coupled to the plurality of transistors N11 to N14, respectively.

The slow quenching section 152 is a circuit section which can control the voltage at the first node Node1 by increments. For example, the slow quenching section 152 may include first to fourth NMOS N11 to N14 responding to first to fourth signals STEP<0:3> which are set to be sequentially enabled and first to fourth resistors R2 to R5 coupled in parallel to the first to fourth NMOS transistors N11 to N14, respectively. The voltage drop resistor R6 is coupled to the slow quenching section 152 and configured to provide a minimum resistance when the first to fourth NMOS transistors N11 to N14 are turned on. The set enable section 154 may include an NMOS transistor N15 configured to discharge a voltage applied to the voltage drop resistor R6 in response to the write set signal WRITESET.

Accordingly, when the set enable section 154 is turned on, the set control unit 150 may vary its input resistance to control the voltage at the first node Node1. The input resistance may be varied by controlling which of the first to fourth resistors R2, R3, R4, and R5 are in series with the voltage drop resistor R6. Since the voltage at the first node Node1 can be incrementally controlled in steps by the set enable section 154, this may be referred to as being slowly controlled by the set control unit 150.

When the set enable section 154 is driven and the first to fourth NMOS transistors N11 to N14 of the set control unit 150 are sequentially turned on by the plurality of step signals STEP<0:3>, a different current transfer path is formed to reduce the voltage of the first node Node1 step by step.

Accordingly, the voltage at the first node Node 1 may be "rapidly" controlled by the reset control unit 130 when the write reset signal WRITERST is asserted, or "slowly" controlled by the set control unit 150 when the write set signal WRITESET is asserted. Since only one of these signals may be generally asserted at any one time, the voltage at the node Node 1 may be controlled by either the reset control unit 130 or the set control unit 150 at any one time.

The write driver enable unit 170 is configured to switch a write driver high voltage VPPYWD in response to the write driver enable signal WDEN. The write driver enable unit 170 according to this embodiment may include a PMOS transistor P11, for example. The write driver enable unit 170 is used to charge the second node Node2. That is, when the write driver enable signal WDEN is low, the second node Node 2 is charged to high, but the write driver enable signal WDEN is high, the second node Node 2 is not charged.

The write driver 190 is configured to provide a write current to a memory cell 200 in response to a voltage of a second node Node2, which is an output voltage of the write driver enable unit 170. A portion of the memory cell 200 may comprise a resistor Rv, which may be a fixed resistor or a variable resistor, whose resistance varies with temperature. The second node Node2 may be considered to be the same node as the first node Node1.

Such a write current control apparatus may be driven as follows.

First, a case in which the internal temperature of the phase change memory apparatus is high will be described.

When the write reset signal WRITERST is enabled to a high level and the write set signal WRITESET is disabled to a low level, the reset control unit 130 is driven. At this time, since the internal temperature is high, the threshold voltage of the first temperature sensing section 111 of the temperature sensing block 110 decreases. Thus, the voltage level of the first node Node1 rises, and the voltage level of the second node Node2 coupled to the first node Node1 also rises.

Figure 4:
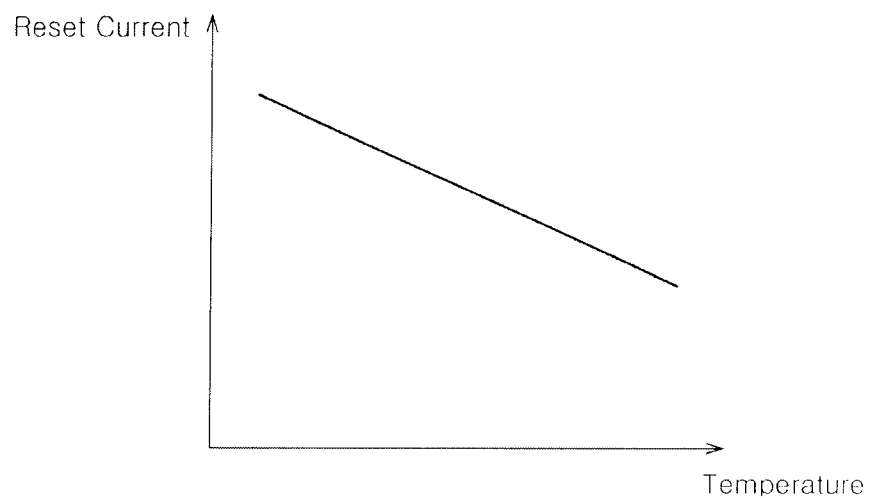
FIG. 4 is a graph showing a reset current depending on temperature in the phase change memory according to an embodiment of the invention.

In such a state, when the write enable signal WDEN is enabled to a low level, a gate-source voltage Vgs of the PMOS transistor P12 forming the write driver 190 decreases. That is, since the gate level of the PMOS transistor P12 rises, the current through the PMOS transistor P12 decreases. Accordingly, as the temperature of the internal circuit increases as shown in FIG. 4, the reset current provided to a bit line BL of the memory cell 200 decreases.

Figure 5:
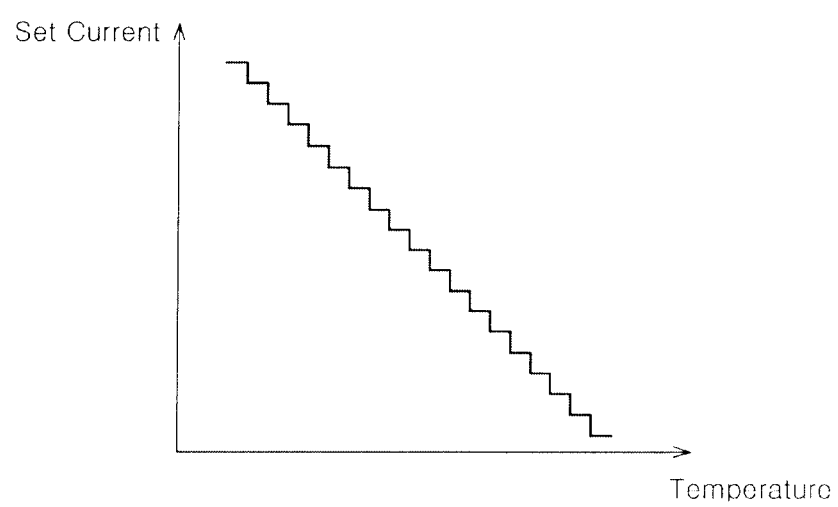
FIG. 5 is a graph showing a set current depending on temperature in the phase change memory according to an embodiment of the invention.

When the write reset signal WRITERST is disabled to a low level and the write set signal WRITESET is enabled, the set enable section 154 is driven. At this time, since the internal temperature is high, the voltage level of the first node Node1 is increased by the temperature sensing block 110, and the gate-source voltage Vgs of the PMOS transistor P12 forming the write driver 190 is decreased by the increase of the voltage level of the first node Node1. Accordingly, the set current is decreased. Additionally, by appropriately controlling the first to fourth NMOS transistors N11 to N14 of the set control unit 150 of the slow quenching section 152, the voltage at node 2 can be further increased, and the set current is reduced step by step as shown in FIG. 5.

Next, a case in which the internal temperature of the phase change memory apparatus is low will be described.

When the write reset signal WRITERST is enabled to a high level and the write set signal WRITESET is disabled to a low level, the reset control unit 130 is driven. At this time, since the internal temperature is low, the threshold voltage of the first temperature sensing section 111 of the temperature sensing block 110 increases, and the voltage level of the first node Node1 is decreased by the increase. The voltage level of the second node Node2 coupled to the first node Node1 is also decreased.

In this state, when the write enable signal WDEN is enabled to a low level, the gate-source voltage Vgs of the PMOS transistor P12 composing the write driver 190 increases, that is, the gate level of the PMOS transistor P12 decreases. Therefore, the current through the PMOS transistor P12 increases. Accordingly, when the internal temperature is low, the reset current provide to the bit line BL of the memory cell 200 is greater than at a higher temperature.

When the write reset signal WRITERST is disabled to a low level and the write set signal WRITESET is enabled to a high level, the set enable section 154 is driven. At this time, since the internal temperature is low, the voltage level of the first node Node1 is decreased by the temperature sensing block 110, and the gate-source voltage Vgs of the PMOS transistor P12 forming the write driver 190 is increased by the decrease of the voltage level of the first node Node1. Thus, the set current is increased.

As described above, when the temperature of the internal circuit of the phase change memory increases, the current control apparatus according to an embodiment provides relatively low set/reset currents to the bit line of the memory cell.

Therefore, according to the temperature change, the circuit itself controls current in the program pulses. Accordingly, an over-driving problem at high temperature may be solved, and disturbance and unnecessary current consumption at low temperature may be reduced.

While certain embodiments have been described above, it will be understood to those skilled in the art that the embodiments described are by way of example only. Accordingly, the current control apparatus and the phase change memory described herein should not be limited based on the described embodiments. Rather, the current control apparatus and the phase change memory described herein should only be limited in light of the claims that follow when taken in conjunction with the above description and accompanying drawings.

What is claimed is:

1. A current control apparatus of a phase change memory, comprising:
a temperature sensing block configured to provide a different level of output voltage that is proportional to temperature;
a reset control unit coupled to the temperature sensing block and configured to be driven during a reset mode;
a set control unit coupled to the temperature sensing block and configured to be driven during a set mode;
a write driver enable unit directly coupled to a output node of the output voltage, and having a switch configured to provide a high voltage to the output node in response to a write driver enable signal; and
a write driver directly coupled between the output node and a memory cell, and configured to provide current that is inversely proportional to the level of the output voltage to the memory cell.

2. The current control apparatus according to claim 1, wherein the temperature sensing block comprises:
a first temperature sensing section having a resistance value which decreases when temperature increases; and
a second temperature sensing section coupled to the first temperature sensing section and having a resistance value which increases when the temperature increases.

3. The current control apparatus according to claim 2, wherein the first temperature sensing section comprises a PMOS transistor.

4. The current control apparatus according to claim 2, wherein the second temperature sensing section comprises a resistor.

5. The current control apparatus according to claim 2, wherein the output voltage of the temperature sensing block is a voltage of a coupling node between the first and second temperature sensing sections.

6. The current control apparatus according to claim 1, wherein the set control unit comprises:
a slow quenching section configured to slowly quench the level of the output voltage step by step; and
a set enable section electrically coupled to the slow quenching section and configured to be driven in response to a write set signal.

7. The current control apparatus according to claim 6, further comprising a voltage drop resistor coupled between the slow quenching section and the set enable section.

8. The current control apparatus according to claim 6, wherein the slow quenching section comprises:
a plurality of NMOS transistors coupled in series and configured to be driven in response to a plurality of step signals; and
a plurality of resistors coupled in parallel to the plurality of NMOS transistors, respectively.

9. The current control apparatus according to claim 1, further comprising a write signal generation unit configured to generate a write reset signal and a write set signal for enabling the reset control unit and the set control unit, respectively.

10. The current control apparatus according to claim 9, wherein the write signal generation unit comprises:
a write reset signal generation section configured to receive a write bit signal and a write driver enable signal, perform an AND operation on the received signals, and generate the write reset signal; and
a write set signal generation section configured to receive an inverted write bit signal and the write driver enable signal, perform an AND operation on the received signals, and generate the write set signal.

11. A phase change memory comprising:
a phase change memory cell comprising a variable resistor having a resistance value which varies depending on temperature; and a current control apparatus configured to sense the temperature, and output current to the phase change memory cell that is inversely proportional to temperature, wherein the current control apparatus comprises:

a temperature sensing block configured to provide a different level of output voltage that is proportional to temperature;

a write driver enable unit directly coupled to a output node of the output voltage, and having a switch configured to provide a high voltage to the output node in response to a write driver enable signal; and a write driver directly coupled between the output node and the phase change memory cell, and configured to provide current that is inversely proportional to the level of the output voltage to the phase change memory cell.

12. The phase change memory according to claim 11, further comprising a reset control unit configured to rapidly control a voltage level of the output node, during a reset driving mode.

13. The phase change memory according to claim 12, further comprising a set control unit configured to slowly control the voltage level of the output node, during a set driving mode.

14. The phase change memory according to claim 11, further comprising a write driver enable unit configured to drive the write driver.

* * * * *